US012761266B2

(12) United States Patent
Zhang

(10) Patent No.: US 12,761,266 B2
(45) Date of Patent: Oct. 13, 2026

(54) COMMON VOLTAGE LOADING ANALOG CIRCUIT AND DISPLAY DEVICE

(71) Applicant: Shenzhen China Star Optoelectronics Semiconductor Display Technology Co., Ltd., Guangdong (CN)

(72) Inventor: Yihua Zhang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 150 days.

(21) Appl. No.: 18/931,229

(22) Filed: Oct. 30, 2024

(65) Prior Publication Data

US 2025/0224439 A1 Jul. 10, 2025

(30) Foreign Application Priority Data

Jan. 10, 2024 (CN) ........................ 202410046742.1

(51) Int. Cl.
*G01R 31/28* (2006.01)
*H03F 3/45* (2006.01)

(52) U.S. Cl.
CPC ...... *G01R 31/2825* (2013.01); *H03F 3/45475* (2013.01); *H03F 2200/129* (2013.01); *H03F 2203/45116* (2013.01); *H03F 2203/45136* (2013.01); *H03F 2203/45512* (2013.01)

(58) Field of Classification Search
CPC ............. G01R 31/2825; H03F 3/45475; H03F 2200/129; H03F 2203/45116; H03F 2203/45136; H03F 2203/45512; H03F 2203/45528; G09G 3/36; G09G 2310/0264; G09G 2320/04
USPC ........................................................ 324/750.3
See application file for complete search history.

(56) References Cited

U.S. PATENT DOCUMENTS

2010/0201669 A1* 8/2010 Kim ..................... G09G 3/3655
345/87
2015/0008981 A1* 1/2015 Lin ................... G02F 1/136259
330/252
2021/0225319 A1* 7/2021 Han ..................... G09G 3/3655

* cited by examiner

*Primary Examiner* — Raul J Rios Russo

(57) ABSTRACT

A common voltage loading analog circuit and a display device are provided. The common voltage loading analog circuit includes a circuit unit to be tested, a load simulation circuit unit, and an auxiliary circuit unit. The load simulation circuit unit includes a signal generator, an amplifier circuit, and a resistance-capacitor series circuit. Through the resistance-capacitor series circuit, an AC component in the output voltage of the load simulation circuit unit can be completely filtered out to the input terminal of the circuit unit to be tested, and then a DC component output from the auxiliary circuit unit to the input terminal of the circuit unit to be tested is superimposed, which makes the voltage at the input terminal of the circuit unit to be tested consistent with the output voltage of the load simulation circuit unit, without attenuation.

20 Claims, 3 Drawing Sheets

COMMON VOLTAGE LOADING ANALOG CIRCUIT AND DISPLAY DEVICE

RELATED APPLICATION

This application is a Paris Convention, which claims the benefit of priority of Chinese Patent Application No. 202410046742.1 filed on Jan. 10, 2024. The contents of the above application is all incorporated by reference as if fully set forth herein in its entirety.

FIELD AND BACKGROUND OF THE INVENTION

The present disclosure relates to the field of display technology, and in particular to a common voltage loading analog circuit and a display device.

Common voltage is used to provide a stable reference voltage for liquid crystals in a LCD panel. However, due to the coupling between data signals, a coupling capacitance is formed between the data signal line and the common voltage, resulting in a coupling effect, which may cause horizontal crosstalk in the LCD panel. Currently, a common voltage reference, that is, an operational amplifier (OP), is usually used for negative feedback compensation to reduce time and amplitude of coupling, so that horizontal crosstalk is mitigated. However, the electrical performance of operational amplifiers produced by different manufacturers with a same specification may be different, resulting in a difference in compensation capability, and a difference in degree of improvement in crosstalk of the LCD panel, and therefore the display effect of the LCD panel, in which operational amplifiers produced by different manufacturers with a same specification are adopted, is different.

In conjunction with FIG. 1 illustrating an existing common voltage loading analog circuit and FIG. 2 illustrating waveform diagrams at point A and point B in the common voltage loading analog circuit shown in FIG. 1, a sine wave generated by a signal generator XFG1 is provided to a positive input terminal of the operational amplifier circuit to simulate a coupled in-plane common voltage by changing an input frequency or amplitude. However, an amplitude of the sine wave generated by the signal generator XFG1 will be attenuated after passing through the first capacitor C1. For example, in case that the signal generator XFG1 outputs a 30 KHz sine wave with an amplitude 1 Vp and a bias voltage of 6V, that is, an upper waveform (at point A). After passing through the capacitor C1, the amplitude of the sine wave, that is, a lower waveform (at point B), remains unchanged with 1 Vp, but the remaining bias voltage is only 1V, which results in an output voltage of the signal generator XFG1 being unable to meet the requirements of a positive input voltage of the operational amplifier to be tested U3.

Therefore, it is necessary to provide a common voltage loading analog circuit to address this defect.

SUMMARY OF THE INVENTION

Embodiments of the present disclosure provide a common voltage loading analog circuit and a display device, which can avoid attenuation of a sine wave signal output by a signal generator during transmission, and test compensation capability of operational amplifiers by simulating a common voltage coupled in a display panel so as to filter out operational amplifiers having inconsistent compensation capability. Thereby, the consistency of the display effect of the liquid crystal display panel, in which operational amplifiers produced by different manufacturers with a same specification are adopted, is improved.

An embodiment of the present disclosure provides a common voltage loading analog circuit configured for testing compensation capability of an operational amplifier to be tested. The common voltage loading analog circuit includes:

a circuit unit to be tested, configured for electrically connecting with a negative input terminal and an output terminal of the operational amplifier to be tested to form a negative feedback compensation circuit;

a load simulation circuit unit, configured for simulating a coupled common voltage, the load simulation circuit unit including a signal generator, an amplifier circuit, and a resistance-capacitor series circuit, wherein the signal generator is electrically connected to an input terminal of the amplifier circuit, an output terminal of the amplifier circuit is electrically connected to an input terminal of the resistance-capacitor series circuit, a first output terminal of the resistance-capacitor series circuit is electrically connected to an input terminal of the circuit unit to be tested, and a second output terminal of the resistance-capacitor series circuit is electrically connected to an output terminal of the circuit unit to be tested; and an auxiliary circuit unit, configured for providing a positive input voltage to a positive input terminal of the operational amplifier to be tested, wherein an output terminal of the auxiliary circuit unit is electrically connected to both the positive input terminal of the operational amplifier to be tested and the input terminal of the circuit unit to be tested.

An embodiment of the present disclosure further provides a display device including the common voltage loading analog circuit as described above.

Beneficial effects of the embodiments of the present disclosure are as follows. The embodiments of the present disclosure provide a common voltage loading analog circuit and a display device, wherein the common voltage loading analog circuit is configured for testing compensation capability of operational amplifiers to be tested. The common voltage loading analog circuit includes a circuit unit to be tested, a load simulation circuit unit, and an auxiliary circuit unit. The load simulation circuit unit includes a signal generator, an amplifier circuit, and a resistance-capacitor series circuit. The signal generator is electrically connected to an input terminal of the amplifier circuit, and an output terminal of the amplifier circuit is electrically connected to an input terminal of the resistance-capacitor series circuit. A first output terminal of the resistance-capacitor series circuit is electrically connected to an input terminal of the circuit unit to be tested, and a second output terminal of the resistance-capacitor series circuit is electrically connected to an output terminal of the circuit unit to be tested. Through the resistance-capacitor series circuit, an AC component in the output voltage of the load simulation circuit unit can be completely filtered out to the input terminal of the circuit unit to be tested, and in combination with a DC component output from the auxiliary circuit unit to the input terminal of the circuit unit to be tested, the voltage at the input terminal of the circuit unit to be tested is consistent with the output voltage of the load simulation circuit unit, without attenuation. Therefore, the accuracy of measuring the compensation effect of the operational amplifiers to be tested is improved, the selection of operational amplifiers with consistent compensation capability is facilitated, and the horizontal crosstalk compensation effect of the liquid crystal display panel, in which operational amplifiers produced by different manufacturers with a same specification are adopted, is consistent. Thereby, the consistency of the display effect of the liquid crystal display panel, in which operational amplifiers produced by different manufacturers with a same specification are adopted, is improved.

DESCRIPTION OF SPECIFIC EMBODIMENTS OF THE INVENTION

Figure 1:
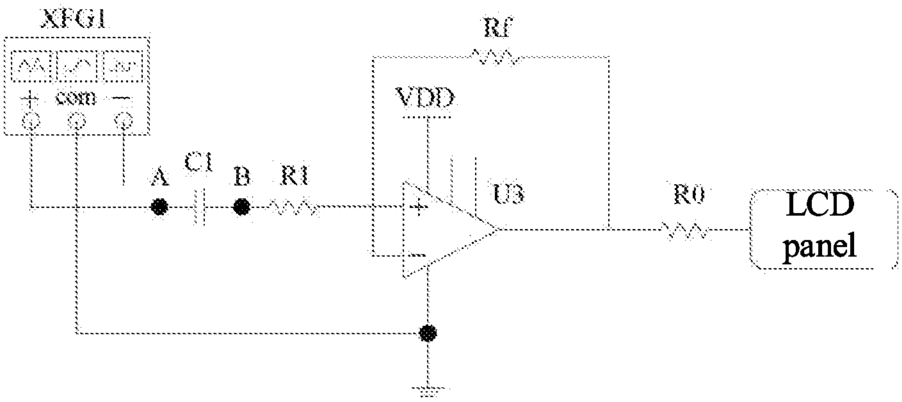
FIG. 1 shows an existing common voltage loading analog circuit.
Figure 2:
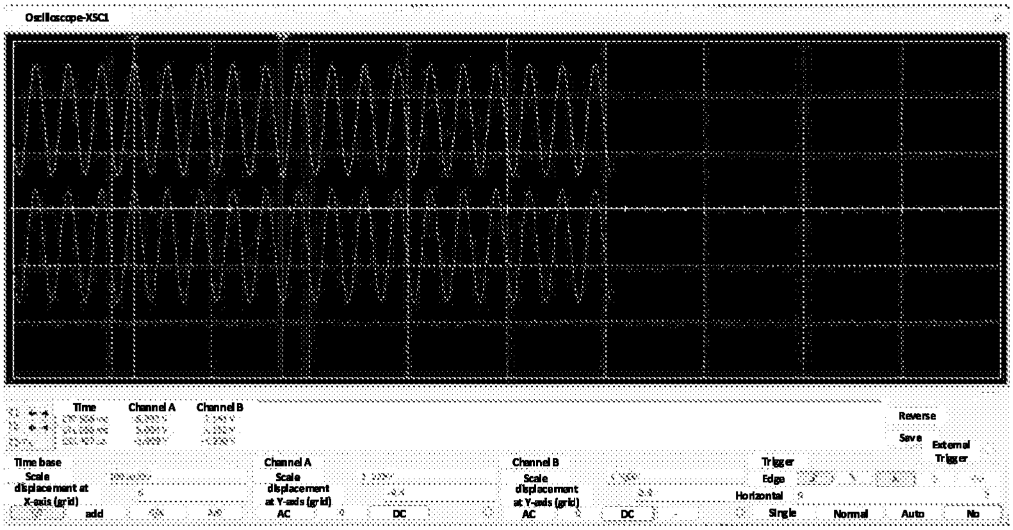
FIG. 2 shows waveform diagrams at point A and point B in the common voltage loading analog circuit shown in FIG. 1.

The following description of the embodiments refers to the accompanying drawings to illustrate specific embodiments which the present disclosure may implement. The directional terms mentioned in the present disclosure, such as "upper", "lower", "front", "back", "left", "right", "inner", "outer", "side", etc. only refer to the direction of the pictures in the drawings. Therefore, the directional terms used are intended to explain and understand the present disclosure, rather than to limit the present disclosure. In the figures, units with similar structures are represented by the same reference numbers.

The present disclosure will be further described below with reference to the accompanying drawings and specific embodiments of the invention.

Embodiments of the present disclosure provide a common voltage loading analog circuit, which can avoid the attenuation of the sine wave signal output by the signal generator during the transmission process, and test compensation capability of operational amplifiers by simulating a common voltage coupled in a display panel so as to filter out operational amplifiers having inconsistent compensation capability. Thereby, the consistency of the display effect of the liquid crystal display panel, in which operational amplifiers produced by different manufacturers with a same specification are adopted, is improved.

Figure 3:
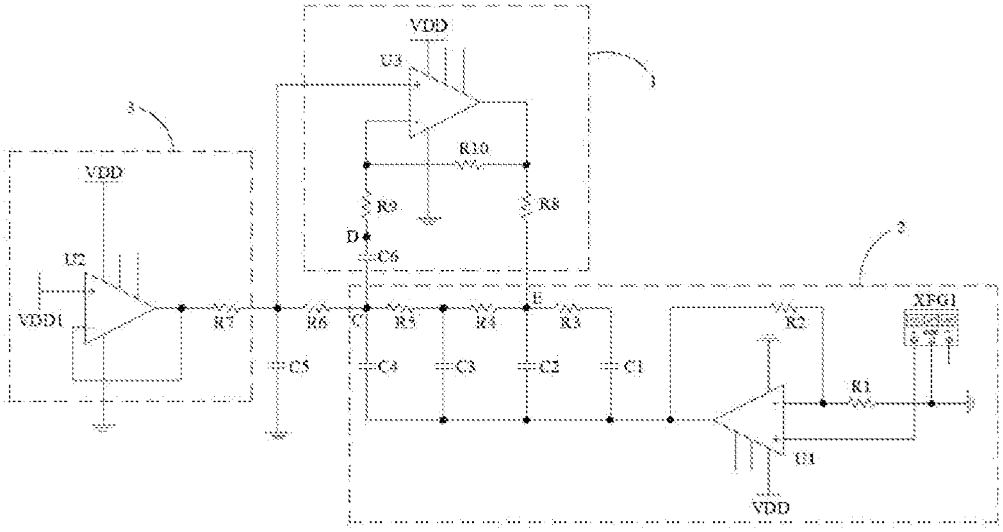
FIG. 3 is a schematic diagram of a structure of a common voltage loading analog circuit according to an embodiment of the present disclosure.

Referring to FIG. 3 schematically illustrating a structure of a common voltage loading analog circuit provided by an embodiment of the present disclosure, the common voltage loading analog circuit includes a circuit unit to be tested 1, a load simulation circuit unit 2, and an auxiliary circuit unit 3. The circuit unit to be tested 1 is configured for electrically connecting with a negative input terminal and an output terminal of an operational amplifier to be tested U3 to form a negative feedback compensation circuit.

It is to be noted that the common voltage loading analog circuit provided by the embodiments of the present disclosure is configured for testing the compensation effect of the operational amplifier to be tested U3. The common voltage loading analog circuit itself does not include the operational amplifier to be tested U3. In practical applications, the operational amplifier to be tested U3 can be any type of operational amplifier, and the operational amplifier to be tested U3 is electrically connected to the circuit unit to be tested 1, the load simulation circuit unit 2, and the auxiliary circuit unit 3 using the connection method shown in FIG. 3, which is not limited here.

The load simulation circuit unit 2 is configured for simulating a coupled common voltage. The load simulation circuit unit 2 includes a signal generator XFG1, an amplifier circuit and a resistance-capacitor series circuit. The signal generator XFG1 is electrically connected to an input terminal of the amplifier circuit, and an output terminal of the amplifier circuit is electrically connected to an input terminal of the resistance-capacitor series circuit. A first output terminal of the resistance-capacitor series circuit is electrically connected to an input terminal of the circuit unit to be tested 1, and a second output terminal of the resistance-capacitor series circuit is electrically connected to an output terminal of the circuit unit to be tested 1.

The auxiliary circuit unit 3 is configured for providing a positive input voltage to a positive input terminal of the operational amplifier to be tested U3. An output terminal of the auxiliary circuit unit 3 is electrically connected to the positive input terminal of the operational amplifier to be tested U3. The output terminal of the auxiliary circuit unit 3 is also electrically connected to the input terminal of the circuit unit to be tested 1.

In this embodiment, a sine wave generated by the signal generator XFG1 is provided to the amplifier circuit to simulate a coupled in-plane common voltage by changing an input frequency or amplitude of the signal generator XFG1. Through the resistance-capacitor series circuit, an AC component in the output voltage of the load simulation circuit unit 2 can be completely filtered out to the input terminal of the circuit unit to be tested 1, and in combination with a DC component output from the auxiliary circuit unit 3 to the input terminal of the circuit unit to be tested 1, the voltage at the input terminal of the circuit unit to be tested 1 is consistent with the output voltage of the load simulation circuit unit 2, without attenuation. Therefore, the accuracy of measuring the compensation effect of the operational amplifiers to be tested U3 is improved, the selection of operational amplifiers with consistent compensation capability is facilitated, and the horizontal crosstalk compensation effect of the liquid crystal display panel, in which operational amplifiers produced by different manufacturers with a same specification are adopted, is consistent. Thereby, the consistency of the display effect of the liquid crystal display panel, in which operational amplifiers produced by different manufacturers with a same specification are adopted, is improved.

In some embodiments, the amplifier circuit includes a first operational amplifier U1, a first resistance R1 and a second resistance R2. A positive input terminal of the first operational amplifier U1 is electrically connected to a positive terminal of the signal generator XFG1. A first terminal of the first resistance R1 is electrically connected to a first terminal of the second resistance R2 and an inversed input terminal of the first operational amplifier U1. A second terminal of the first resistance R1 and a common terminal of the signal generator XFG1 are both grounded. A second terminal of the second resistance R2 and an output terminal of the first operational amplifier U1 are both electrically connected to the input terminal of the resistance-capacitor series circuit.

In one embodiment, the resistance-capacitor series circuit includes a first capacitor C1, a second capacitor C2, a third capacitor C3, a fourth capacitor C4, a third resistance R3, a fourth resistance R4, and a fifth resistance R5. First terminals of the first capacitor C1, of the second capacitor C2, of the third capacitor C3, and of the fourth capacitor C4 are all electrically connected to the output terminal of the first operational amplifier U1. A second terminal of the first capacitor C1 is connected with the third resistance R3, the fourth resistance R4, and the fifth resistance R5 sequentially in series. The second terminal of the second capacitor C2 along with the third resistance R3 and the fourth resistance R4 are electrically connected to the output terminal of the circuit unit to be tested 1. A second terminal of the third capacitor C3 is electrically connected to a series common point between the fourth resistance R4 and the fifth resistance R5, and a second terminal of the fourth capacitor C4 along with the fifth resistance R5 are electrically connected to the input terminal of the circuit unit to be tested 1.

In some embodiments, the auxiliary circuit unit 3 includes a second operational amplifier U2 and a seventh resistance R7. A positive input terminal of the second operational amplifier U2 is input with a DC high-voltage signal. An inversed input terminal and an output terminal of the second operational amplifier U2 are electrically connected to a first terminal of the seventh resistance R7, and a second terminal of the seventh resistance R7 is electrically connected to the positive input terminal of the operational amplifier to be tested U3.

Negative power terminals of both the first operational amplifier U1 and the second operational amplifier U2 are connected to a DC low-voltage signal. A maximum value of the DC low-voltage signal is greater than a maximum value of an input voltage of the operational amplifier to be tested U3. A minimum value of the DC low-voltage signal is smaller than the minimum value of an input voltage of the operational amplifier to be tested U3. An input voltage of the operational amplifier to be tested U3 is the difference between a positive input voltage and an inversed input voltage of the operational amplifier to be tested U3. That means, the ranges of the DC voltage signals of both the first operational amplifier U1 and the second operational amplifier U2 are greater than the range of the input voltage of the operational amplifier to be tested U3.

In one embodiment, the first operational amplifier U1, the second operational amplifier U2, and the operational amplifier to be tested U3 are of a same model. The models of the first operational amplifier U1, of the second operational amplifier U2, and of the operational amplifier to be tested U3 are all OPA604AP. In practical applications, the models of the first operational amplifier U1, of the second operational amplifier U2, and of the operational amplifier to be tested U3 can be selected according to actual needs, rather than being limited to the above models.

In some embodiments, the common voltage loading analog circuit further includes a fifth capacitor C5. A first terminal of the fifth capacitor C5 and the second terminal of the seventh resistance R7 are electrically connected to the positive input terminal of the operational amplifier to be tested U3. A second terminal of the fifth capacitor C5 is grounded.

In some embodiments, the common voltage loading analog circuit further includes a sixth resistance R6. A first terminal of the sixth resistance R6 is electrically connected to the input terminal of the circuit unit to be tested 1. A second terminal of the sixth resistance R6 is electrically connected to the positive input terminal of the operational amplifier to be tested U3.

In some embodiments, the circuit unit to be tested 1 includes an eighth resistance R8, a ninth resistance R9, a tenth resistance R10, and a sixth capacitor C6. A first terminal of the eighth resistance R8 is electrically connected to both a first terminal of the tenth resistance R10 and the output terminal of the operational amplifier to be tested U3. A second terminal of the eighth resistance R8 is electrically connected to the second output terminal of the resistance-capacitor series circuit. The second output terminal of the resistance-capacitor series circuit is a series common point between the third resistance R3 and the fourth resistance R4. That means, the second terminal of the eighth resistance R8 is electrically connected to the series common point between the third resistance R3 and the fourth resistance R4. A first terminal of the ninth resistance R9 is electrically connected to a second terminal of the tenth resistance R10 and an inversed input terminal of the operational amplifier to be tested U3. A second terminal of the ninth resistance R9 is electrically connected to a first terminal of the sixth capacitor C6. A second terminal of the sixth capacitor C6 is electrically connected to the first output terminal of the resistance-capacitor series circuit. The first output terminal of the resistance-capacitor series circuit is a series common point between the sixth resistance R6 and the fifth resistance R5. That means, the second terminal of the sixth capacitor C6 is electrically connected to the series common point between the sixth resistance R6 and the fifth resistance R5.

In one embodiment, as shown in FIG. 3, positive power terminals of the first operational amplifier U1, of the second operational amplifier U2 and of the operational amplifier to be tested U3 are input with a first DC high-voltage signal VDD. A positive input terminal of the second operational amplifier U2 is input with a second DC high-voltage signal VDD1. The voltage of the first DC high-voltage signal VDD is greater than the voltage of the second DC high-voltage signal VDD1. The voltage of the first DC high-voltage signal VDD is 17V, and the voltage of the second DC high-voltage signal VDD1 is 6V.

The resistance values of the first resistance R1 and the second resistance R2 are both 1 kΩ. The resistance values of the third resistance R3, the fourth resistance R4, the fifth resistance R5, the sixth resistance R6, the seventh resistance R7 and the eighth resistance R8 are all 10Ω. The resistance value of the ninth resistance R9 is 1 kΩ. The resistance value of the tenth resistance R10 is 2 kΩ. The capacitances of the first capacitor C1, the second capacitor C2, the third capacitor C3, the fourth capacitor C4 and the fifth capacitor C5 are all 10 nF, and the capacitance of the sixth capacitor C6 is 0.1 μF. In practical applications, the resistance values of each resistance and the capacitance of each capacitor can be set according to actual needs, rather than being limited to the numerical values in the above embodiments.

By the resistance-capacitor series circuit, the AC component in the signal output by the output terminal of the first operational amplifier U1 can be completely filtered out to the first node C shown in FIG. 3, which is the input terminal of the circuit unit to be tested 1. Then the DC component output from the auxiliary circuit unit 3 to the input terminal of the circuit unit to be tested 1 is superimposed. Since DC components of the load simulation circuit unit 2 and the auxiliary circuit unit 3 are the same, and the AC components of the load simulation circuit unit 2 and the auxiliary circuit unit 3 are different, the voltage of the first node C can be kept consistent with the output voltage of the load simulation circuit unit 2, without attenuation. Thus, the output voltage of the signal generator XFG1 can be ensured to satisfy the input voltage of the operational amplifier to be tested.

Figure 4:
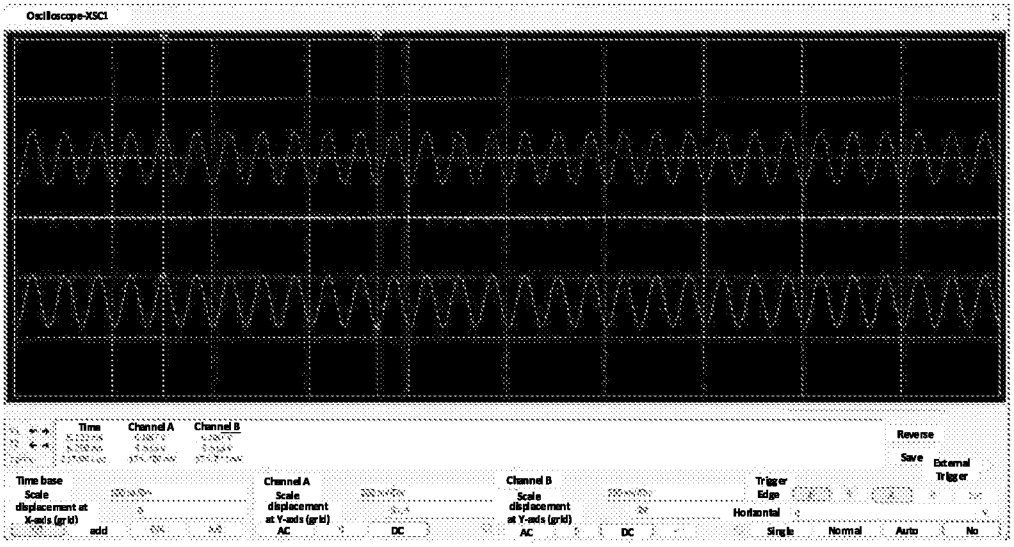
FIG. 4 shows waveform diagrams of voltages of a first node C and a second node D in the common voltage loading analog circuit according to an embodiment of the present disclosure.

As shown in FIG. 4 illustrating waveform diagrams of voltages of a first node C and a second node D in the common voltage loading analog circuit according to an embodiment of the present disclosure, the upper waveform is the waveform diagram of the first node C, and the lower waveform is the waveform diagram of the second node D. The sine wave signal output by the load simulation circuit unit 2 passes through the resistance-capacitor series circuit and reaches the first node C without attenuation. The sine wave signal will not experience attenuation even after passing through the sixth capacitor C6. Therefore, the attenuation problem of the output voltage of the signal generator of the existing common voltage loading analog circuit can be solved. In case that the common voltage coupled at the terminals of the display is simulated by the load simulation circuit unit 2, the negative feedback compensation effect of the operational amplifier to be tested can be accurately measured.

By adjusting the ratio of the first resistance R1 to the second resistance R2, the frequency and amplitude of the input voltage of the load simulation circuit unit 2 can be adjusted, thereby changing the frequency and amplitude of the output voltage of the load simulation circuit unit 2, and thereby changing the frequency and amplitude of the inversed input voltage of the operational amplifier to be tested U3. Since the positive input voltage of the operational amplifier to be tested U3 remains unchanged, the difference of the positive input voltage (Vin+) and the inversed input voltage (Vin−) of the operational amplifier to be tested increases. Due to the principle of negative feedback amplification, the output voltage of the circuit unit to be tested 1 varies inversely with the difference between the positive input voltage (Vin+) and the negative input voltage (Vin−), and thus, the output current of the circuit unit to be tested 1 is changed.

For example, the output voltage amplitude of the load simulation circuit unit 2 increases. In order to maintain the stability of the output voltage of the circuit unit to be tested 1, it is necessary to reduce the output voltage of the circuit unit to be tested 1. At this time, the current will increase, while the output current of the circuit unit to be tested 1 can be controlled by reducing the voltage amplitude of the load simulation circuit unit 2.

Figure 5:
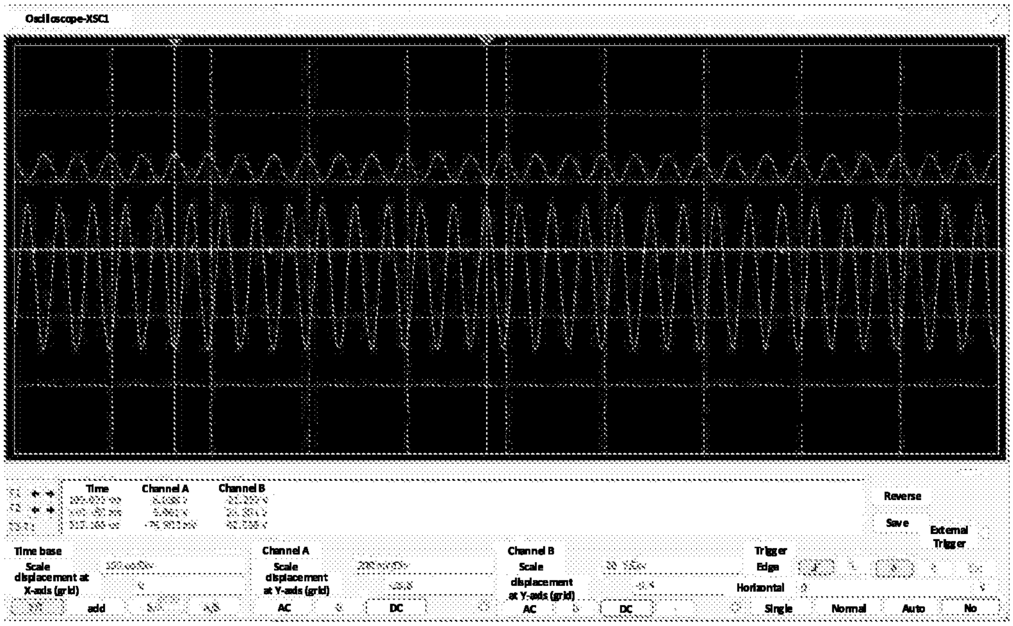
FIG. 5 shows waveform diagrams of an output current and an output voltage of a third node E in the common voltage loading analog circuit according to an embodiment of the present disclosure.

The compensation capability of the operational amplifier to be tested U3 can be judged by testing the amplitude of the output current at the output terminal of the circuit unit to be tested 1 (i.e., the third node E) and the "timeliness" of compensation. FIG. 5 shows a waveform diagram of the output current at the output terminal (i.e., the third node E) of the circuit unit to be tested 1, which is measured by using the current probe (1V/mA). The lower waveform in FIG. 5 is the waveform of the output current of the third node E, and the upper waveform in FIG. 5 is the waveform of the output voltage of the third node E. It can be seen that the maximum of the output current is 21.301 mA and the minimum of output current is −21.257 mA. The output current of the circuit unit to be tested 1 can be controlled by controlling the output voltage of the load simulation circuit unit 2. In this way, not only the attenuation of the sine wave signal output by the signal generator XFG1 can be avoided, but also the circuits of the display panel with different crosstalk degrees can be simulated, so that the applicability of the common voltage loading analog circuit is improved, the difficulty of testing the performance of the operational amplifier is reduced, and the testing efficiency is improved.

In addition to the common voltage loading analog circuit provided in the above embodiments of the present disclosure, another embodiment of the present disclosure provides a display device, which includes the common voltage loading analog circuit provided in any of the above embodiments.

Beneficial effects of the embodiments of the present disclosure are as follows. The embodiments of the present disclosure provide a common voltage loading analog circuit, the common voltage loading analog circuit is configured for testing compensation capability of operational amplifiers to be tested. The common voltage loading analog circuit includes a circuit unit to be tested, a load simulation circuit unit, and an auxiliary circuit unit. The load simulation circuit unit includes a signal generator, an amplifier circuit, and a resistance-capacitor series circuit. The signal generator is electrically connected to an input terminal of the amplifier circuit, and an output terminal of the amplifier circuit is electrically connected to an input terminal of the resistance-capacitor series circuit. A first output terminal of the resistance-capacitor series circuit is electrically connected to an input terminal of the circuit unit to be tested, and a second output terminal of the resistance-capacitor series circuit is electrically connected to an output terminal of the circuit unit to be tested. Through the resistance-capacitor series circuit, an AC component in the output voltage of the load simulation circuit unit can be completely filtered out to the input terminal of the circuit unit to be tested, and in combination with a DC component output from the auxiliary circuit unit to the input terminal of the circuit unit to be tested, the voltage at the input terminal of the circuit unit to be tested is consistent with the output voltage of the load simulation circuit unit, without attenuation. Therefore, the accuracy of measuring the compensation effect of the operational amplifiers to be tested is improved, the selection of operational amplifiers with consistent compensation capability is facilitated, and the horizontal crosstalk compensation effect of the liquid crystal display panel, in which operational amplifiers produced by different manufacturers with a same specification are adopted, is consistent. Thereby, the consistency of the display effect of the liquid crystal display panel, in which operational amplifiers produced by different manufacturers with a same specification are adopted, is improved.

In summary, although the present disclosure has been stated as above with preferred embodiments, the above preferred embodiments are not intended to limit the present disclosure. A person skilled in the art may make various modifications and refinements without departing from the spirit and scope of the present disclosure, and therefore the scope of protection of the present disclosure shall be based on the scope defined by the claims.

What is claimed is:

1. A common voltage loading analog circuit, wherein the common voltage loading analog circuit is configured for testing compensation capability of an operational amplifier to be tested, the common voltage loading analog circuit comprising:

a circuit unit to be tested, configured for electrically connecting with a negative input terminal and an output terminal of the operational amplifier to be tested to form a negative feedback compensation circuit;

a load simulation circuit unit, configured for simulating a coupled common voltage, the load simulation circuit unit comprising a signal generator, an amplifier circuit, and a resistance-capacitor series circuit, wherein the signal generator is electrically connected to an input terminal of the amplifier circuit, an output terminal of the amplifier circuit is electrically connected to an input terminal of the resistance-capacitor series circuit, a first output terminal of the resistance-capacitor series circuit is electrically connected to an input terminal of the circuit unit to be tested, and a second output terminal of the resistance-capacitor series circuit is electrically connected to an output terminal of the circuit unit to be tested; and an auxiliary circuit unit, configured for providing a positive input voltage to a positive input terminal of the operational amplifier to be tested, wherein an output terminal of the auxiliary circuit unit is electrically connected to both the positive input terminal of the operational amplifier to be tested and the input terminal of the circuit unit to be tested.

2. The common voltage loading analog circuit of claim 1, wherein the amplifier circuit comprises a first operational amplifier, a first resistance, and a second resistance, a positive input terminal of the first operational amplifier is electrically connected to a positive terminal of the signal generator, a first terminal of the first resistance is electrically connected to a first terminal of the second resistance and an inversed input terminal of the first operational amplifier, a second terminal of the first resistance and a common terminal of the signal generator are both grounded, and a second terminal of the second resistance and an output terminal of the first operational amplifier are both electrically connected to the input terminal of the resistance-capacitor series circuit.

3. The common voltage loading analog circuit of claim 2, wherein the resistance-capacitor series circuit comprises a first capacitor, a second capacitor, a third capacitor, a fourth capacitor, a third resistance, a fourth resistance, and a fifth resistance;

wherein first terminals of the first capacitor, of the second capacitor, of the third capacitor, and of the fourth capacitor are all electrically connected to the output terminal of the first operational amplifier, and a second terminal of the first capacitor is connected to the third resistance, the fourth resistance, and the fifth resistance sequentially in series, a series common point between the third resistance and the fourth resistance along with a second terminal of the second capacitor are electrically connected at the output terminal of the circuit unit to be tested, a second terminal of the third capacitor is electrically connected at a series common point between the fourth resistance and the fifth resistance, and a second terminal of the fourth capacitor along with the fifth resistance are electrically connected at the input terminal of the circuit unit to be tested.

4. The common voltage loading analog circuit of claim 3, wherein the auxiliary circuit unit comprises a second operational amplifier and a seventh resistance, a positive input terminal of the second operational amplifier is input with a DC high-voltage signal, an inversed input terminal and an output terminal of the second operational amplifier are electrically connected to a first terminal of the seventh resistance, and a second terminal of the seventh resistance is electrically connected to the positive input terminal of the operational amplifier to be tested.

5. The common voltage loading analog circuit of claim 2, wherein the auxiliary circuit unit comprises a second operational amplifier and a seventh resistance, a positive input terminal of the second operational amplifier is input with a DC high-voltage signal, an inversed input terminal and an output terminal of the second operational amplifier are electrically connected to a first terminal of the seventh resistance, and a second terminal of the seventh resistance is electrically connected to the positive input terminal of the operational amplifier to be tested.

6. The common voltage loading analog circuit of claim 1, wherein the auxiliary circuit unit comprises a second operational amplifier and a seventh resistance, a positive input terminal of the second operational amplifier is input with a DC high-voltage signal, an inversed input terminal and an output terminal of the second operational amplifier are electrically connected to a first terminal of the seventh resistance, and a second terminal of the seventh resistance is electrically connected to the positive input terminal of the operational amplifier to be tested.

7. The common voltage loading analog circuit of claim 6, wherein the common voltage loading analog circuit further comprises a fifth capacitor, a first terminal of the fifth capacitor along with the second terminal of the seventh resistance are electrically connected at the positive input terminal of the operational amplifier to be tested, and a second terminal of the fifth capacitor is grounded.

8. The common voltage loading analog circuit of claim 6, wherein negative power terminals of the first operational amplifier and the second operational amplifier are both input with a DC low-voltage signal, a maximum value of the DC low-voltage signal is greater than a maximum value of an input voltage of the operational amplifier to be tested, and a minimum value of the DC low-voltage signal is smaller than a minimum value of the input voltage of the operational amplifier to be tested.

9. The common voltage loading analog circuit of claim 8, wherein the first operational amplifier and the second operational amplifier are of a same model.

10. The common voltage loading analog circuit of claim 1, wherein the common voltage loading analog circuit further comprises a sixth resistance, a first terminal of the sixth resistance is electrically connected to the input terminal of the circuit unit to be tested, and a second terminal of the sixth resistance is electrically connected to the positive input terminal of the operational amplifier to be tested.

11. The common voltage loading analog circuit of claim 10, wherein the circuit unit to be tested comprises an eighth resistance, a ninth resistance, a tenth resistance, and a sixth capacitor;

wherein a first terminal of the eighth resistance is electrically connected to both a first terminal of the tenth resistance and the output terminal of the operational amplifier to be tested, a second terminal of the eighth resistance is electrically connected to the second output terminal of the resistance-capacitor series circuit, a first terminal of the ninth resistance is electrically connected to a second terminal of the tenth resistance and an inversed input terminal of the operational amplifier to be tested, a second terminal of the ninth resistance is electrically connected to a first terminal of the sixth capacitor, and a second terminal of the sixth capacitor is electrically connected to the first output terminal of the resistance-capacitor series circuit.

12. A display device comprising a common voltage loading analog circuit, wherein the common voltage loading analog circuit is configured for testing compensation capability of an operational amplifier to be tested, the common voltage loading analog circuit comprising:

a circuit unit to be tested, configured for electrically connecting with a negative input terminal and an output terminal of the operational amplifier to be tested to form a negative feedback compensation circuit;

a load simulation circuit unit, configured for simulating a coupled common voltage, the load simulation circuit unit comprising a signal generator, an amplifier circuit, and a resistance-capacitor series circuit, wherein the signal generator is electrically connected to an input terminal of the amplifier circuit, an output terminal of the amplifier circuit is electrically connected to an input terminal of the resistance-capacitor series circuit, a first output terminal of the resistance-capacitor series circuit is electrically connected to an input terminal of the circuit unit to be tested, and a second output terminal of the resistance-capacitor series circuit is electrically connected to an output terminal of the circuit unit to be tested; and an auxiliary circuit unit configured for providing a positive input voltage to a positive input terminal of the operational amplifier to be tested, wherein an output terminal of the auxiliary circuit unit is electrically connected to both the positive input terminal of the operational amplifier to be tested and the input terminal of the circuit unit to be tested.

13. The display device of claim 12, wherein the amplifier circuit comprises a first operational amplifier, a first resistance, and a second resistance, a positive input terminal of the first operational amplifier is electrically connected to a positive terminal of the signal generator, a first terminal of the first resistance is electrically connected to a first terminal of the second resistance and an inversed input terminal of the first operational amplifier, a second terminal of the first resistance and a common terminal of the signal generator are both grounded, and a second terminal of the second resistance and an output terminal of the first operational amplifier are both electrically connected to the input terminal of the resistance-capacitor series circuit.

14. The display device of claim 13, wherein the resistance-capacitor series circuit comprises a first capacitor, a second capacitor, a third capacitor, a fourth capacitor, a third resistance, a fourth resistance, and a fifth resistance;

wherein first terminals of the first capacitor, of the second capacitor, of the third capacitor, and of the fourth capacitor are all electrically connected to the output terminal of the first operational amplifier, a second terminal of the first capacitor is connected to the third resistance, the fourth resistance, and the fifth resistance sequentially in series, a series common point between the third resistance and the fourth resistance along with a second terminal of the second capacitor are electrically connected at the output terminal of the circuit unit to be tested, a second terminal of the third capacitor is electrically connected at a series common point between the fourth resistance and the fifth resistance, and a second terminal of the fourth capacitor along with the fifth resistance are electrically connected at the input terminal of the circuit unit to be tested.

15. The display device of claim 12, wherein the auxiliary circuit unit comprises a second operational amplifier and a seventh resistance, a positive input terminal of the second operational amplifier is input with a DC high-voltage signal, an inversed input terminal and an output terminal of the second operational amplifier are electrically connected to a first terminal of the seventh resistance, and a second terminal of the seventh resistance is electrically connected to the positive input terminal of the operational amplifier to be tested.

16. The display device of claim 15, wherein the common voltage loading analog circuit further comprises a fifth capacitor, a first terminal of the fifth capacitor along with the second terminal of the seventh resistance are electrically connected at the positive input terminal of the operational amplifier to be tested, and a second terminal of the fifth capacitor is grounded.

17. The display device of claim 15, wherein negative power terminals of the first operational amplifier and the second operational amplifier are both input with a DC low-voltage signal, a maximum value of the DC low-voltage signal is greater than a maximum value of an input voltage of the operational amplifier to be tested, and a minimum value of the DC low-voltage signal is smaller than a minimum value of the input voltage of the operational amplifier to be tested.

18. The display device of claim 17, wherein the first operational amplifier and the second operational amplifier are of a same model.

19. The display device of claim 12, wherein the common voltage loading analog circuit further comprises a sixth resistance, a first terminal of the sixth resistance is electrically connected to the input terminal of the circuit unit to be tested, and a second terminal of the sixth resistance is electrically connected to the positive input terminal of the operational amplifier to be tested.

20. The display device of claim 19, wherein the circuit unit to be tested comprises an eighth resistance, a ninth resistance, a tenth resistance, and a sixth capacitor;

wherein a first terminal of the eighth resistance is electrically connected to both a first terminal of the tenth resistance and the output terminal of the operational amplifier to be tested, a second terminal of the eighth resistance is electrically connected to the second output terminal of the resistance-capacitor series circuit, a first terminal of the ninth resistance is electrically connected to a second terminal of the tenth resistance and an inversed input terminal of the operational amplifier to be tested, a second terminal of the ninth resistance is electrically connected to a first terminal of the sixth capacitor, and a second terminal of the sixth capacitor is electrically connected to the first output terminal of the resistance-capacitor series circuit.

* * * * *